US012683276B2

(12) United States Patent

Timmins et al.

(10) Patent No.: US 12,683,276 B2

(45) Date of Patent: Jul. 14, 2026

(54) METHOD OF IMPROVED POWER INTEGRITY FOR mmWAVE PHASED ARRAY ANTENNAS USING MICROVIAS

(71) Applicant: JABIL INC., St. Petersburg, FL (US)

(72) Inventors: Ian Jeffery Timmins, St. Petersburg, FL (US); Babak Zarrin Rafie, St. Petersburg, FL (US); Youssef Faltone, St. Petersburg, FL (US); John Finnell, St. Petersburg, FL (US)

(73) Assignee: Jabil Inc., Petersburg, FL (US)

( * ) Notice: Subject to any disclaimer, the term of this patent is extended or adjusted under 35 U.S.C. 154(b) by 243 days.

(21) Appl. No.: 18/694,811

(22) PCT Filed: Sep. 16, 2022

(86) PCT No.: PCT/US2022/076551

§ 371 (c)(1),
(2) Date: Mar. 22, 2024

(87) PCT Pub. No.: WO2023/049665

PCT Pub. Date: Mar. 30, 2023

(65) Prior Publication Data

US 2024/0405427 A1 Dec. 5, 2024

Related U.S. Application Data

(60) Provisional application No. 63/261,489, filed on Sep. 22, 2021.

(51) Int. Cl.
*H01Q 3/36* (2006.01)
*H05K 1/11* (2006.01)
*H05K 1/03* (2006.01)

(52) U.S. Cl.
CPC .............. *H01Q 3/36* (2013.01); *H05K 1/115* (2013.01); *H05K 1/0366* (2013.01); *H05K 2201/10098* (2013.01)

(58) Field of Classification Search
CPC ................................. H01Q 3/36; H05K 1/115
(Continued)

(56) References Cited

U.S. PATENT DOCUMENTS

| | | | | |
|---|---|---|---|---|
| 11,569,574 B2 * | 1/2023 | Benedict | .................. | H01Q 3/26 |
| 12,512,602 B2 * | 12/2025 | Fonseca | .............. | H01Q 21/064 |

(Continued)

FOREIGN PATENT DOCUMENTS

| | | | | |
|---|---|---|---|---|
| WO | WO-2017144599 A1 * | 8/2017 | ............. | H05K 1/183 |
| WO | WO2019190417 | * 10/2019 | ............... | H04B 1/16 |

OTHER PUBLICATIONS

Watanabe Atom O et al: "Low-Loss Impedance-Matched Sub-25-μm vias in 3-D Millimeter-Wave Packages", IEEE Transactions on Components, Packaging and Manufacturing Technology, Mar. 20, 2020, pp. 870-877.

(Continued)

*Primary Examiner* — Harry K Liu

(74) *Attorney, Agent, or Firm* — John A. Miller; Shumaker, Loop & Kendrick, LLP

(57) ABSTRACT

A mmWave antenna that has particular application to be used in a 5G radio. The antenna includes a thick copper power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin copper power layer formed on a side of second prepreg layer opposite to the signal layer. Microvias extend through the first prepreg layer that electrically couple the thick copper layer to the signal layer and microvias extend through the second prepreg layer that electrically couple the thin copper layer to the signal layer, where the number of microvias extending through the (Continued)

first prepreg layer is less than the number of microvias extending through the second prepreg layer.

19 Claims, 2 Drawing Sheets

(58) Field of Classification Search
USPC ......................................................... 342/371
See application file for complete search history.

(56) References Cited

U.S. PATENT DOCUMENTS

| | | |
|---|---|---|
| 2011/0006861 A1 | 1/2011 | White et al. |
| 2021/0075122 A1 | 3/2021 | Thai et al. |
| 2021/0127484 A1 | 4/2021 | Yoon et al. |
| 2021/0273358 A1 | 9/2021 | Ooi et al. |
| 2021/0305947 A1* | 9/2021 | El Sabbagh ........ H04L 25/0272 |

OTHER PUBLICATIONS

Mohammad Mosalanejad et al: "Millimeter Wave Cavity Backed Microstrip Antenna Array for 79 GHZ Radar Applications", Progress in Electromagnetics Research, Jan. 1, 2017 , pp. 89-98.
Amin Enayati et al: "Millimeter-Wave Horn-Type Antenna-in-Package Solution Fabricated in a Teflon-Based Multilayer PCB Technology", IEEE Transactions on Antennas and Propagation, Jan. 25, 2013, pp. 1581-1590.

* cited by examiner

METHOD OF IMPROVED POWER INTEGRITY FOR mmWAVE PHASED ARRAY ANTENNAS USING MICROVIAS

BACKGROUND

Field

This disclosure relates generally to a millimeter wave (mmWave) antenna and, more particularly, to a mmWave phased array antenna including a structure of microvias provided between power layers.

Discussion of the Related Art

Cellular telecommunications companies began deploying fifth generation (5G) radio technology standard for cellular networks in 2019. The 5G radio standard utilizes a higher frequency spectrum than previous generations of commercial communications technologies. MmW phased array antennas are being designed and developed for the 5G protocol that provides increased performance over 4G systems while also reducing costs. 5G mmWave antennas typically require precise manufacturing of printed circuit boards (PCBs) because antenna features on the order of a wavelength are at the limits of manufacturing tolerance of the PCB fabrication process.

5G mmWave antennas are characteristically challenged with both high heat conditions and simultaneously supporting high current application specific integrated circuits (ASIC) requirements that collectively are comparable to high performance microprocessors. This causes a number of concerns about providing adequate copper within a PCB assembly that supports the ASICs used for beamforming integrated circuits (ICs) and at the same time, the increased copper weight reduces accuracy of PCB etching levels typically required for mmWave frequency RF components to be implemented in a PCB suitable for high volume low cost manufacturing. PCB surface area is a premium design consideration, where the aperture of the antenna is to be maximized, while at the same time the overall size of the PCB is to be minimized as a cost reduction effort.

The PCB for mmWave antennas is generally a composition of laminate materials and copper together. The different weights of copper are of different physical thickness, and subsequently the heavier the weight, the greater the current carrying capacity of the layer. Typically, the PCB used for mmWave is fabricated using a solid core, and the repetitively bonding prepreg layers in sequential steps to build up the layers of the PCB. For a typical PCB fabrication, the use of plated through hole (PTH) vias is implemented by drilling through the entire PCB, and plating the hole. This provides an interconnect between layers, but the amount of copper between the top and bottom layers remains constant. In this case, cores and prepregs are alternated throughout the structure, and there is a single pressing of the cores and laminates to fabricate the overall PCB.

SUMMARY

The following discussion discloses and describes a mmWave phased array antenna that has particular application to be used in a 5G radio. The antenna includes a PCB structure having a plurality of layers that include a thick copper power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin copper power layer formed on a side of second prepreg layer opposite to the signal layer. A plurality of microvias extend through the first prepreg layer that electrically couple the thick copper layer to the signal layer and a plurality of microvias extend through the second prepreg layer that electrically couple the thin copper layer to the signal layer, where the number of microvias extending through the first prepreg layer is less than the number of microvias extending through the second prepreg layer.

Additional features of the disclosure will become apparent from the following description and appended claims, taken in conjunction with the accompanying drawings.

DETAILED DESCRIPTION

The following discussion of the embodiments of the disclosure directed to a mmWave phased array antenna including a structure of microvias provide between power layers is merely exemplary in nature, and is in no way intended to limit the disclosure or its applications or uses. For example, the discussion herein refers to the antenna as being part of a phased array antenna for a 5G radio. However, as will be appreciated by those skilled in the art, the antenna will have other applications.

Figure 1:
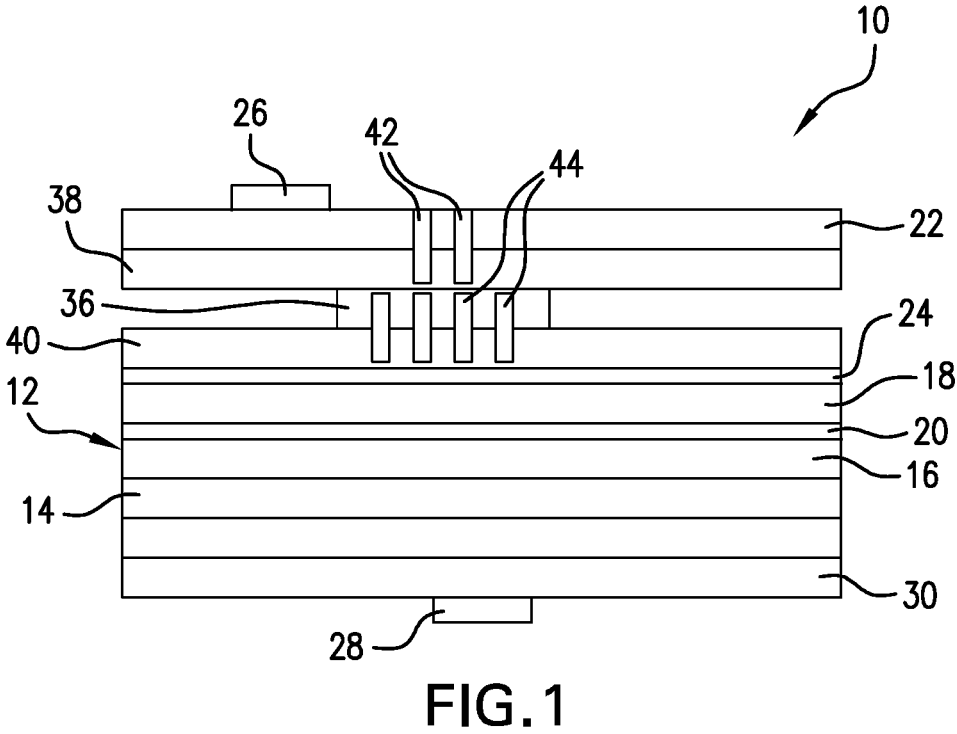
FIG. 1 is a profile view of a mmWave phased array antenna including a structure of microvias provide between power layers.

FIG. 1 is a profile view of a mmWave phased array antenna 10, where the antenna 10 can be part of a 5G radio. The antenna 10 includes a PCB structure 12 having a stack of layers 14 including core dielectric layers 16, dielectric insulating prepreg layers 18, a feed layer 20, a thick copper power layer 22 and a thin copper power layer 24, where the number, thickness, configuration, material, etc. of the layers 14 would be designed for a particular antenna as would be well understood by those skilled in the art. A beamforming IC 26 is provided at one side of the PCB structure 12 and includes the circuitry necessary for beam phase combining and beam steering for multiple radiating elements in the phased array antenna in a manner well understood by those skilled in the art. Multiple beamforming ICs 26 would be provided for the phased array antenna 10. A patch antenna radiating element 28 is formed at an opposite side of the PCB structure 12 from the beamforming IC 26 on a dielectric layer 30 and would be one of many radiating elements formed on the PCB structure 12 to provide the phased array antenna 10, where the radiating element 28 could be formed of ½ oz copper.

A signal layer 36 is provided between two prepreg layers 38 and 40, where the layer 38 is adjacent to the power layer 22 and the layer 40 is adjacent to the power layer 24. An array of microvias 42 extend through the prepreg layer 38 and electrically couple the thick power layer 22 to the signal layer 36 and an array of microvias 44 extend through the prepreg layer 40 and electrically couple the thin power layer 24 to the signal layer 36, where the number of the vias 42 is less than the number of the vias 44. By using the microvias 42 between layers of thicker copper, i.e., the layers 22 and 36, the number of the microvias 42 can be reduced, which minimizes the footprint of the transition on the thick power layer 22, and then the microvia density is increased on the thin copper layer 24 to provide more copper to support the high currents typically required for mmWave phased array antennas.

Figure 2:
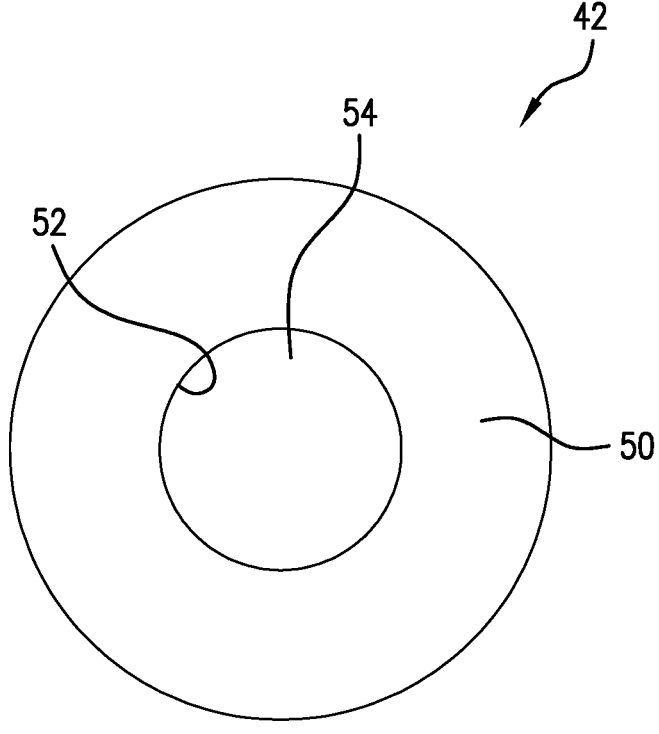
FIG. 2 is a top view of a microvia.

FIG. 2 is a top view of one of the microvias 42 and includes a conductive pad 50 and a drilled hole 52 including plating 54 that forms the via 42. The pad 50 provides forgiveness for manufacturing alignment tolerance as the layers 14 can slip when assembled, and thus provides robustness to connectivity of the PTH to each layer 14 through which it passes.

Microvias are implemented individually on each layer in a sequential pressing process. Thus, it is possible to scale up or down the number of vias to compensate for the thickness of copper on each layer. Layers that have thick copper on the dielectric material can use less vias, and thus cause a minimal footprint of the layer transition structure. When transitions approach a layer with thinner copper thickness, the number of microvias can be increased to provide increased surface area and thus lower the current density introduced by the transition onto the thinner copper layer. Since high performance RF materials are characteristically easier to delaminate the copper, this method of increasing the microvia density onto thinner weight layers also provides increased mechanical support through the thermal cycling of the PCB structure, thus increasing the longevity of the PCB structure comparatively. Furthermore, the increase of microvia density to a thinner copper layer adds robustness to the PCB design to protect it from mechanical stress during thermal cycling of the typically high temperature levels of mmWave phased array antennas. This approach can offset the characteristically easier delamination of copper from materials that are low loss at mmWave.

Figure 3:
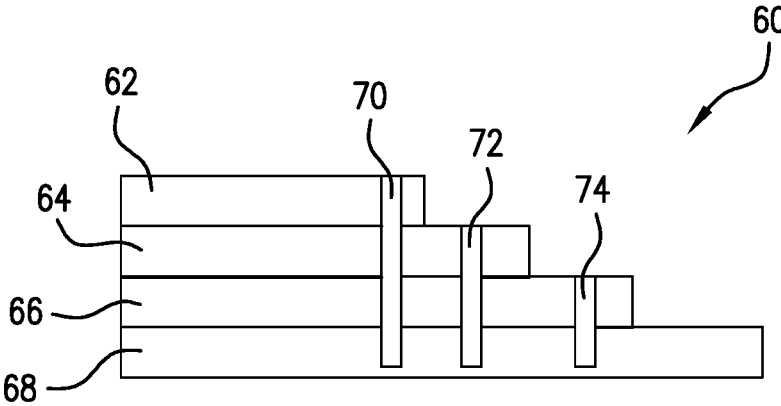
FIG. 3 is a profile view of an antenna structure including microvias coupling staircase layers between outer layers and inner layers.

FIG. 3 is a profile view of a PCB structure 60 that can be employed in a mmWave phased array antenna as discussed above. The structure 60 includes four copper layers 62, 64, 66 and 68 of increasing length to form a "staircase" structure. A microvia 70 extends through all of the layers 62-68, a microvia 72 extends through the layers 64-68 and a microvia 74 extends through the layers 66 and 68.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An antenna comprising:
a printed circuit board (PCB) structure including a plurality of layers, said plurality of layers including a thick conductive power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin conductive power layer formed on a side of second prepreg layer opposite to the signal layer; and
a plurality of microvias extending through the first prepreg layer that electrically couple the thick conductive layer to the signal layer and a plurality of microvias extending through the second prepreg layer that electrically couple the thin conductive layer to the signal layer, wherein the number of microvias extending through the first prepreg layer is less than the number of microvias extending through the second prepreg layer.

2. The antenna according to claim 1 further comprising a beamforming integrated circuit (IC) formed on the thick conductive layer.

3. The antenna according to claim 2 further comprising an antenna radiating element formed on a dielectric layer at an opposite side of the PCB structure from the beamforming IC.

4. The antenna according to claim 3 wherein the antenna radiating element is a patch antenna radiating element.

5. The antenna according to claim 1 wherein the thick and thin conducting layers are copper layers.

6. The antenna according to claim 1 wherein the antenna is a phased array antenna.

7. The antenna according to claim 6 wherein the antenna is part of a 5G radio.

8. A phased array antenna comprising:
a printed circuit board (PCB) structure including a plurality of layers, said plurality of layers including a thick copper power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin copper power layer formed on a side of second prepreg layer opposite to the signal layer; and
a plurality of microvias extending through the first prepreg layer that electrically couple the thick copper layer to the signal layer and a plurality of microvias extending through the second prepreg layer that electrically couple the thin copper layer to the signal layer, wherein the number of microvias extending through the first prepreg layer is less than the number of microvias extending through the second prepreg layer.

9. The antenna according to claim 8 further comprising a beamforming integrated circuit (IC) formed on the thick copper layer.

10. The antenna according to claim 9 further comprising an antenna radiating element formed on a dielectric layer at an opposite side of the PCB structure from the beamforming IC.

11. The antenna according to claim 10 wherein the antenna radiating element is a patch antenna radiating element.

12. The antenna according to claim 8 wherein the antenna is part of a 5G radio.

13. A phased array antenna comprising:
a printed circuit board (PCB) structure including a plurality of layers, said plurality of layers including a thick copper power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin copper power layer formed on a side of second prepreg layer opposite to the signal layer;
a plurality of microvias extending through the first prepreg layer that electrically couple the thick copper layer to the signal layer and a plurality of microvias extending through the second prepreg layer that electrically couple the thin copper layer to the signal layer, wherein the number of microvias extending through the first prepreg layer is less than the number of microvias extending through the second prepreg layer;

a beamforming integrated circuit (IC) formed on the thick copper layer; and a patch antenna radiating element formed on a dielectric layer at an opposite side of the PCB structure from the beamforming IC.

14. The antenna according to claim 13 wherein the antenna is part of a 5G radio.

15. An antenna comprising:

a printed circuit board (PCB) structure including a plurality of layers, said plurality of layers including a thick conductive power layer, a first prepreg layer formed on one side of the thick power layer, a signal layer formed on a side of the first prepreg layer opposite to the thick power layer, a second prepreg layer formed on a side of the signal layer opposite to the first prepreg layer and a thin conductive power layer formed on a side of second prepreg layer opposite to the signal layer;

a plurality of microvias extending through the first prepreg layer that electrically couple the thick conductive layer to the signal layer and a plurality of microvias extending through the second prepreg layer that electrically couple the thin conductive layer to the signal layer;

a beamforming integrated circuit (IC) formed on the thick conductive layer; and an antenna radiating element formed on a dielectric layer at an opposite side of the PCB structure from the beamforming IC.

16. The antenna according to claim 3 wherein the antenna radiating element is a patch antenna radiating element.

17. The antenna according to claim 1 wherein the thick and thin conducting layers are copper layers.

18. The antenna according to claim 1 wherein the antenna is a phased array antenna.

19. The antenna according to claim 18 wherein the antenna is part of a 5G radio.

* * * * *